United States Patent
Yamamoto et al.

(10) Patent No.: US 10,529,643 B2
(45) Date of Patent: Jan. 7, 2020

(54) SEMICONDUCTOR DEVICE AND METHOD OF MANUFACTURING THE SAME

(71) Applicant: Mitsubishi Electric Corporation, Chiyoda-ku (JP)

(72) Inventors: Kei Yamamoto, Chiyoda-ku (JP); Hodaka Rokubuichi, Chiyoda-ku (JP); Dai Nakajima, Chiyoda-ku (JP); Kiyofumi Kitai, Chiyoda-ku (JP); Yoichi Goto, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/758,381

(22) PCT Filed: Sep. 20, 2016

(86) PCT No.: PCT/JP2016/077680
§ 371 (c)(1),
(2) Date: Mar. 8, 2018

(87) PCT Pub. No.: WO2017/057093
PCT Pub. Date: Apr. 6, 2017

(65) Prior Publication Data
US 2018/0261520 A1    Sep. 13, 2018

(30) Foreign Application Priority Data

Sep. 29, 2015    (JP) .................................. 2015-190885

(51) Int. Cl.
*H01L 23/34*    (2006.01)
*H01L 23/367*    (2006.01)
(Continued)

(52) U.S. Cl.
CPC ...... *H01L 23/3672* (2013.01); *H01L 21/4882* (2013.01); *H01L 21/56* (2013.01);
(Continued)

(58) Field of Classification Search
CPC .. H01L 23/3672; H01L 23/28; H01L 23/4334
(Continued)

(56) References Cited

U.S. PATENT DOCUMENTS 5,041,902 A * 8/1991 McShane .............. H01L 23/367
257/706
5,455,462 A * 10/1995 Marrs ................. H01L 21/4878
257/712
(Continued)

FOREIGN PATENT DOCUMENTS

JP    08-107166 A    4/1996
JP    09-22970 A    1/1997
(Continued)

OTHER PUBLICATIONS

Office Action dated Jun. 7, 2017 in Japanese application No. 2017-527381 (with English translation).
(Continued)

*Primary Examiner* — Nitin Parekh
(74) *Attorney, Agent, or Firm* — Oblon, McClelland, Maier & Neustadt, L.L.P.

(57) ABSTRACT

A semiconductor device that reduces the deformation of a metal base due to pressure during transfer molding, to thereby suppress the occurrence of cracks in an insulating layer to achieve high electrical reliability. The semiconductor device includes: a metal member provided, on its lower surface, with a projection and a depression, and a projecting peripheral portion surrounding the projection and the depression and having a height greater than or equal to a height of the projection of the projection and the depression; an insulating layer formed on an upper surface of the metal member; a metal layer formed on an upper surface of the insulating layer; a semiconductor element joined to an upper surface of the metal layer; and a sealing resin to seal the
(Continued)

semiconductor element, the metal layer, the insulating layer and the metal member.

13 Claims, 11 Drawing Sheets

(51) Int. Cl.
*H01L 23/373* (2006.01)
*H01L 21/56* (2006.01)
*H01L 21/48* (2006.01)
*H01L 23/00* (2006.01)
*H01L 25/07* (2006.01)
*H01L 25/00* (2006.01)
*H01L 23/31* (2006.01)

(52) U.S. Cl.
CPC .......... *H01L 23/3735* (2013.01); *H01L 24/32* (2013.01); *H01L 24/83* (2013.01); *H01L 25/072* (2013.01); *H01L 25/50* (2013.01); *H01L 23/3121* (2013.01); *H01L 24/48* (2013.01); *H01L 24/73* (2013.01); *H01L 2224/32245* (2013.01); *H01L 2224/48245* (2013.01); *H01L 2224/73265* (2013.01); *H01L 2924/1203* (2013.01); *H01L 2924/13055* (2013.01); *H01L 2924/13091* (2013.01); *H01L 2924/3511* (2013.01); *H01L 2924/3512* (2013.01)

(58) Field of Classification Search
USPC .................................................. 257/713, 796
See application file for complete search history.

(56) References Cited

U.S. PATENT DOCUMENTS

| | | | | |
|---|---|---|---|---|
| 5,751,552 A | * | 5/1998 | Scanlan | H01L 23/367 174/548 |
| 5,773,886 A | * | 6/1998 | Rostoker | F28F 3/02 165/80.3 |
| 8,648,461 B2 | * | 2/2014 | Seki | H01L 23/4093 257/713 |
| 8,772,923 B2 | * | 7/2014 | Minamio | H01L 21/565 257/674 |
| 8,836,103 B2 | | 9/2014 | Nishi et al. | |
| 2001/0032715 A1 | | 10/2001 | Peng | |
| 2004/0108102 A1 | | 6/2004 | Otsuki et al. | |
| 2010/0019379 A1 | * | 1/2010 | Zhao | H01L 21/4871 257/713 |
| 2012/0091573 A1 | | 4/2012 | Sasaki et al. | |
| 2014/0035120 A1 | | 2/2014 | Nishi et al. | |
| 2016/0225691 A1 | * | 8/2016 | Sanda | H01L 23/36 |

FOREIGN PATENT DOCUMENTS

| | | |
|---|---|---|
| JP | 2001-358480 A | 12/2001 |
| JP | 2004-071751 A | 3/2004 |
| JP | 2009-177038 A | 8/2009 |
| JP | 2011-86721 A | 4/2011 |
| JP | 3168201 U | 6/2011 |
| JP | 2011-249465 A | 12/2011 |
| JP | 2012-84708 A | 4/2012 |
| JP | 2014-33096 A | 2/2014 |

OTHER PUBLICATIONS

International Search Report dated Nov. 15, 2016 in PCT/JP2016/077680, filed on Sep. 20, 2016.

* cited by examiner

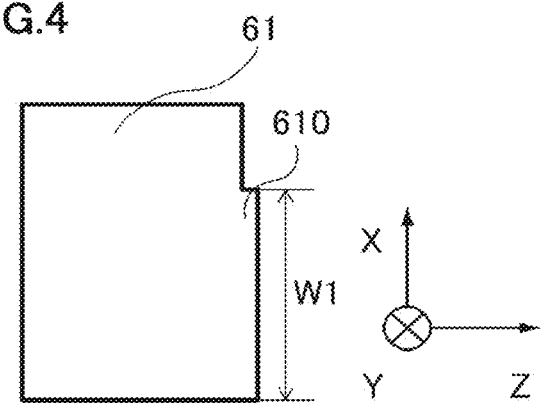
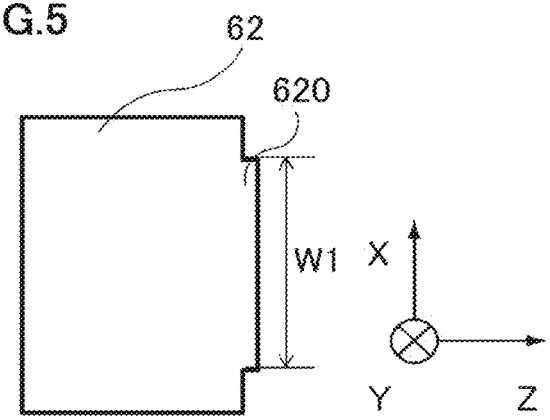
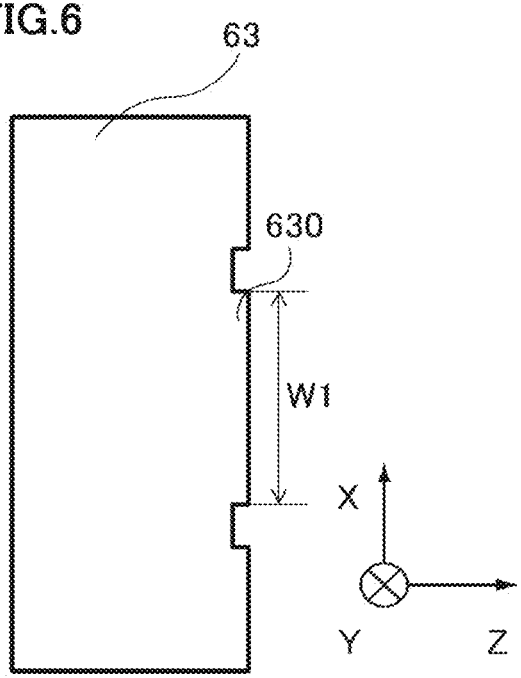

SEMICONDUCTOR DEVICE AND METHOD OF MANUFACTURING THE SAME

TECHNICAL FIELD

The present invention relates to a fin-integrated semiconductor device having a simple structure with good heat dissipation properties and quality, and a method of manufacturing the same.

BACKGROUND ART

A conventional semiconductor device has a semiconductor element, which is a heat generating component, mounted thereon. The semiconductor element generates heat when the semiconductor device is driven. To improve dissipation of this heat, a thick metal substrate or ceramic substrate provided with a circuit pattern is used. In addition, to increase a heat dissipation area to improve the heat dissipation, a fin base including heat dissipation fins is screwed and joined to the metal substrate with an insulative silicone-based resin material such as grease interposed therebetween, for example.

A semiconductor device thus configured, however, requires a step of applying the silicone-based resin material to a surface of the metal substrate or ceramic substrate or of a heat dissipation member, resulting in an increased number of manufacturing steps. Furthermore, heat dissipation properties deteriorate due to the silicone-based resin material interposed between the metal substrate or ceramic substrate and the fin base.

Therefore, as a technique that does not include the resin material interposed as described above, for example, there has been proposed a semiconductor device which includes a ceramic substrate mounted on a metal plate with fins, and which is entirely sealed with epoxy resin (for example, PTD 1 and PTD 2).

CITATION LIST

Patent Documents

PTD 1: Japanese Patent Laying-Open No. 2009-177038 (Page 7, FIG. 1)
PTD 2: Japanese Patent Laying-Open No. 9-22970 (Page 2, FIG. 3)

SUMMARY OF INVENTION

Technical Problem

A conventional semiconductor device, which is resin-molded by transfer molding, is characterized by excellent mass productivity and long-term reliability. However, when a semiconductor device including a metal base plate having projections and depressions on its one surface is resin-molded by transfer molding, a die needs to have an engraved structure for protecting the projections and depressions without causing resin leakage to the projections and depressions. To prevent the resin leakage to the projections and depressions in consideration of a manufacturing dimensional tolerance for the projections as well, a clearance is needed at the engraved portion of the die between the tips of the projections and a die surface. As a result, the metal base plate is deformed due to temperature and pressure during the resin molding, causing cracks to occur in an insulating layer to deteriorate the insulation properties.

This invention was made to solve the problems as described above, and provides a semiconductor device capable of reducing the deformation of a metal base due to pressure during transfer molding, to thereby suppress the occurrence of cracks in an insulating layer to achieve improved electrical reliability.

Solution to Problem

A semiconductor device according to this invention includes: a metal member provided, on its lower surface, with projections and depressions aligned such that surfaces of the projections in a width direction face one another in one direction, a projecting peripheral portion surrounding the projections and the depressions and having a height greater than or equal to a height of the projections of the projections and the depressions, and projections provided in the depressions of the projections and the depressions in a direction intersecting the projections and the depressions and having a height greater than a height of bottom surfaces of the depressions of the projections and the depressions and smaller than the height of the projections of the projections and the depressions; an insulating layer formed on an upper surface of the metal member; a metal layer formed on an upper surface of the insulating layer; a semiconductor element joined to an upper surface of the metal layer; and a sealing resin to seal the semiconductor element, the metal layer, the insulating layer and the metal member.

Advantageous Effects of Invention

According to this invention, since the projecting peripheral portion is provided to surround the projection and the depression formed on the lower surface of the metal base plate, the occurrence of cracks in the insulating layer formed on the upper surface of the metal base plate can be suppressed, thereby improving the reliability of the semiconductor device.

BRIEF DESCRIPTION OF DRAWINGS

FIG. 4 is a schematic diagram of another heat dissipation fin in the first embodiment of this invention.
FIG. 5 is a schematic diagram of another heat dissipation fin in the first embodiment of this invention.
FIG. 6 is a schematic diagram of another heat dissipation fin in the first embodiment of this invention.

DESCRIPTION OF EMBODIMENTS

Embodiments of a semiconductor device according to the present invention will be described below in detail based on the drawings. It should be noted that the present invention is not limited to the following description, and can be modified as appropriate without departing from the scope of the present invention.

First Embodiment

Figure 1:
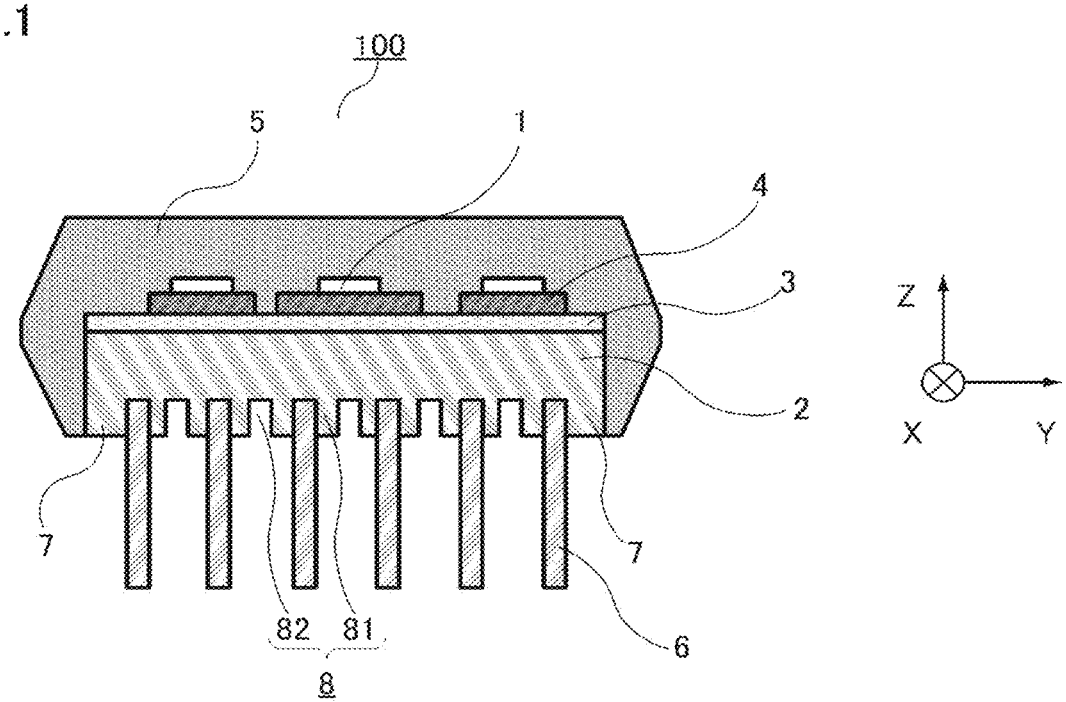
FIG. 1 is a schematic sectional structural diagram of a semiconductor device in a first embodiment of this invention.

FIG. 1 is a schematic sectional structural diagram of a semiconductor device in a first embodiment of this invention. It should be noted that FIG. 1 is a sectional view schematically showing a configuration of the semiconductor device, and therefore shows positional relation of respective parts, components, and the like in an overview manner.

In the figure, a semiconductor device 100 includes a semiconductor element 1, a metal base plate 2 which is a metal member, an insulating sheet 3 which is an insulating layer, a metal wiring pattern 4 which is a metal layer, a sealing resin 5, a heat dissipation fin 6 which is a fin, a peripheral portion 7, a projection 81, and a depression 82. As shown, an X direction represents the width, a Y direction represents the thickness, and a Z direction represents the height.

A power control semiconductor element such as a MOS-FET (Metal Oxide Semiconductor Field Effect Transistor) or an IGBT (Insulated Gate Bipolar Transistor), a reflux diode, or the like is used as semiconductor element 1.

Metal base plate 2 has the functions of a metal substrate (insulation properties and heat dissipation properties) by including insulating sheet 3 on its upper surface (one surface). Metal base plate 2 also includes a projection and a depression 8 having projection 81 and depression 82 on its lower surface (the other surface) exposed at sealing resin 5. A region sandwiched between projection 81 and projection 81 serves as depression 82. Metal base plate 2 has, owing to its uneven shape provided by projection and depression 8, the function of permitting heat dissipation fin 6 to be inserted therein. Thus, an amount of projection (height) of projection 81 does not need to have the length of the heat dissipation fin. Since the heat dissipation properties only need to be ensured by inserting heat dissipation fin 6 into semiconductor device 100, projection 81 only needs to have a height necessary for the insertion of heat dissipation fin 6. Depression 82 only needs to have a thickness (space) into which heat dissipation fin 6 can be inserted.

Furthermore, if the amount of projection (height) of projection and depression 8 is adequate in terms of thermal capacity of semiconductor device 100, this projection and depression 8 may play a role as a heat dissipation fin. The lower surface of metal base plate 2 is provided with projecting peripheral portion 7 to surround this projection and depression 8.

Furthermore, metal base plate 2 is made of a metal material having high thermal conductivity and good heat dissipation properties, such as aluminum or copper, and includes insulating sheet 3 made of thermosetting resin such as epoxy resin on its upper surface opposite to the surface provided with projection and depression 8.

Insulating sheet 3 is formed, for example, by filling thermosetting resin such as epoxy resin with inorganic powders such as silica, alumina, boron nitride, or aluminum nitride, used either alone or as a mixture, which has high thermal conductivity for improving the heat dissipation properties.

Insulating sheet 3 having higher heat dissipation properties is often more highly filled with the inorganic powders, and needs to be heated, pressed and cured at higher pressure in order to ensure its inherent thermal conductivity and insulation properties.

Metal wiring pattern 4 is pattern-formed on insulating sheet 3 by etching and the like, and is made of copper, for example. An electronic component such as semiconductor element 1 is joined and mounted on this metal wiring pattern 4 with solder (not shown). Metal wiring pattern 4 and semiconductor element 1 are electrically connected by a bonding wire (not shown). It should be noted that semiconductor element 1 is not limited to Si (silicon), and may be SiC (silicon carbide) or the like that permits operation at high temperature. A metal wire such as a ribbon or DLB may be used, other than the bonding wire, as long as metal wiring pattern 4 and semiconductor element 1 can be electrically connected.

Sealing resin 5 is a molding member made of epoxy-based resin and provided to cover the top of insulating sheet 3 including the components such as semiconductor element 1, and doubles as a case of semiconductor device 100. As shown in FIG. 1, it is preferable that the area covered by sealing resin 5 be not only on the upper surface side of metal base plate 2, but also on the side surfaces of metal base plate 2 (side surfaces of peripheral portion 7). Such a structure prevents warpage and the occurrence of cracks in semiconductor device 100 due to thermal stress and the like, leading to improved reliability.

While not particularly limited, a material for sealing resin 5 is preferably a material filled with inorganic powders such as silica to have a thermal expansion coefficient closer to the thermal expansion coefficient of copper, semiconductor element 1 and the like, in order to suppress the warpage of the entire semiconductor device 100, or, when heat dissipation fin 6 is intended to be swaged later, is preferably epoxy-based resin having mechanical strength to resist breakage under stress such as a press pressure during the swaging.

Heat dissipation fin 6 is inserted into depression 82 of projection and depression 8 of metal base plate 2. Heat dissipation fin 6 can be fixed to depression 82 by an insertion method using swaging, brazing, or a fixing member. Heat dissipation fin 6 does not need to have a width matching the width of projection and depression 8 of metal base plate 2, and can have an insertable shape with respect to the shape of projection and depression 8 of metal base plate 2, thereby further improving the heat dissipation properties of semiconductor device 100. To fix heat dissipation fins 6 by swaging, heat dissipation fins 6 are alternately disposed for every plurality of depressions.

Figure 2:
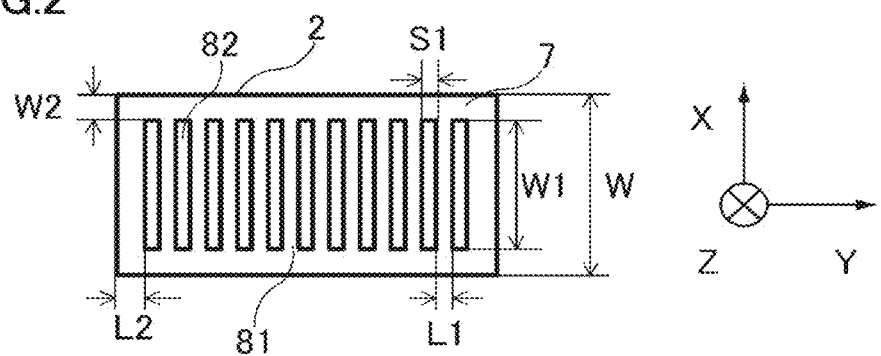
FIG. 2 is a schematic planar structural diagram of a metal base plate in the first embodiment of this invention.

FIG. 2 is a schematic planar structural diagram of the metal base plate in the first embodiment of this invention. FIG. 2 is a schematic planar structural diagram of metal base plate 2 as seen from its lower surface side. In the figure, depression 82 is provided in the form of a slit in metal base plate 2. The outer side (outer periphery) of projection and depression 8 is surrounded by projecting peripheral portion 7. Here, the width of metal base plate 2 in the X direction is represented by W, the width of projection 81 and depression 82 is represented by W1, the thickness of projection 81 is represented by L1, and the gap of depression 82 is represented by S1. The width of projecting peripheral portion 7 surrounding projection and depression 8 is represented by W2 and the thickness thereof is represented by L2, where W2=L2 is satisfied. However, W2 and L2 do not need to be the same size as long as peripheral portion 7 can produce the effect of suppressing the deformation of metal base plate 2. The subsequent schematic planar structural diagrams represent the lower surface side of the metal base plate.

The dimension of W2 may be set to be greater (thicker) than L1 so as to suppress the deformation of metal base plate 2. For example, the dimension of W2 may be twice or more as great as L1, and can be selected as appropriate depending on the size and heat dissipation performance of metal base plate 2. When L1 is 0.5 mm, W2 can be set to 1 mm or more, such as 1.5 mm or 2 mm. When W2 is 1 mm or less, the effect of suppressing the deformation of metal base plate 2 during transfer molding is lessened, and W2 is therefore desirably 1 mm or more.

The dimension of W2 satisfies a relation of W1≥6×W2. When W1 is ¾ or less of W, the strength of projection and depression 8 cannot be ensured upon swaging of heat dissipation fin 6. Thus, it may not be possible to hold heat dissipation fin 6. When W1 is ¾ or more of the width of metal base plate 2, on the other hand, the strength of projection and depression 8 can be ensured even upon swaging of heat dissipation fin 6. It is then possible to keep holding heat dissipation fin 6. Again in this case, the dimension of W2 can be selected as appropriate depending on the size and the like of metal base plate 2.

Projections 81 provided on the lower surface of metal base plate 2 are aligned such that their respective surfaces in the width direction face one another in one direction, as shown in FIG. 2, and the outer peripheral portion of these projections and depressions 8 is surrounded by flat and projecting peripheral portion 7. Depressions 82 are provided in the form of slits. Furthermore, while it is preferable that peripheral portion 7 has a constant (equal) height, it is not necessarily required for projections 81 of projections and depressions 8 to have a height identical to the height of peripheral portion 7. That peripheral portion 7 has an equal height means that, once metal base plate 2 is mounted in a molding die with its upper surface on which insulating sheet 3 has been formed as the upper side, the surface of insulating sheet 3 is flat with respect to the mounting surface of metal base plate 2. To suppress the deformation (warpage) by pressure during resin molding, however, it is desirable that some of projections 81 have a height identical to the height of peripheral portion 7.

The height of heat dissipation fin 6 and the height of projection 81 are defined in the X direction, the width of projection 81 and depression 82 is defined in the X direction, and the thickness (L1) of projection 81 and the gap (S1) of depression 82 are defined in the Y direction. S1 needs to have a width that permits heat dissipation fin 6 to be inserted into S1, depending on the thickness of heat dissipation fin 6. L1 needs to have a width that permits heat dissipation fin 6 to be inserted into S1 and swaged. S1 and L1 may be the same width or different widths, and may be set to dimensions that permit their functions to be carried out.

Figure 3:
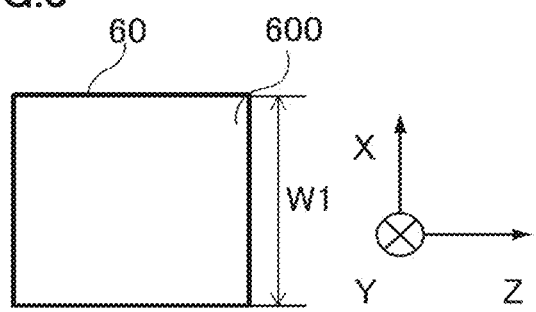
FIG. 3 is a schematic diagram of a heat dissipation fin in the first embodiment of this invention.

FIG. 3 is a schematic diagram of a heat dissipation fin in the first embodiment of this invention. FIG. 4 is a schematic diagram of another heat dissipation fin in the first embodiment of this invention. FIG. 5 is a schematic diagram of another heat dissipation fin in the first embodiment of this invention. FIG. 6 is a schematic diagram of another heat dissipation fin in the first embodiment of this invention. In the figures, heat dissipation fins 60, 61, 62 and 63 include protrusions 600, 610, 620 and 630 of width W1 each inserted into depression 82 of projection and depression 8. By inserting each of these protrusions 600, 610, 620 and 630 into depression 82 of projection and depression 8, heat dissipation fins 60, 61, 62 and 63 are mounted on metal base plate 2. Heat dissipation fins 61, 62 and 63 have portions wider than protrusions 610, 620 and 630.

Figure 7:
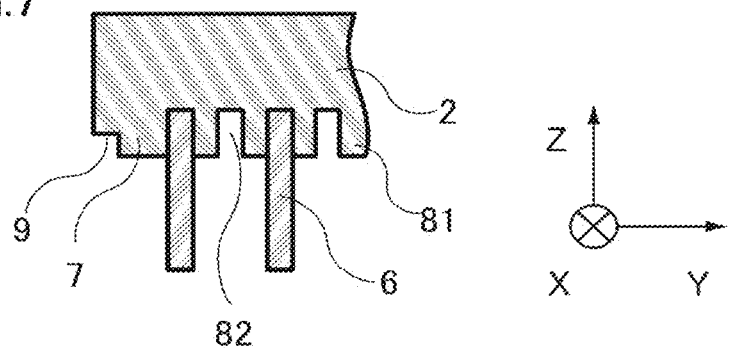
FIG. 7 is a schematic sectional structural diagram of another metal base plate in the first embodiment of this invention.
Figure 8:
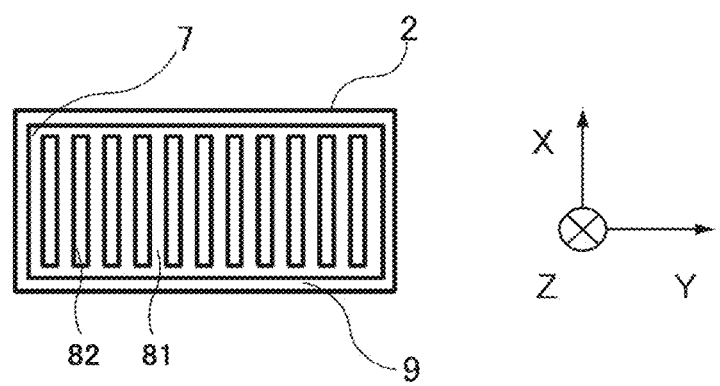
FIG. 8 is a schematic planar structural diagram of the another metal base plate in the first embodiment of this invention, as seen from its lower surface side.

FIG. 7 is a schematic sectional structural diagram of another metal base plate in the first embodiment of this invention. FIG. 8 is a schematic planar structural diagram of the another metal base plate in the first embodiment of this invention, as seen from its lower surface side. In the figures, the outer peripheral portion of peripheral portion 7 is provided with a step 9. This step 9 is formed in a direction from the lower surface toward the upper surface of metal base plate 2. To improve the reliability of semiconductor device 100, it is more preferable that sealing resin 5 have a locking structure to lock metal base plate 2, instead of merely covering the side surfaces of metal base plate 2. While the outer peripheral portion of peripheral portion 7 has step 9 to structurally provide a projection and a depression in FIG. 7, the portion of this step 9 at the outer peripheral portion will be covered by sealing resin 5 after transfer molding, leading to a structure to lock metal base plate 2.

This step 9 causes sealing resin 5 to wrap around the lower surface side of metal base plate 2 during transfer molding. Step 9 does not need to have a depth of depression 82 (step height from the lower surface side to the upper surface side) for the insertion of heat dissipation fin 6. The step only needs to permit sealing resin 5 to wrap around the lower surface of metal base plate 2 during transfer molding. The structure provided with such step 9 can achieve the effect of suppressing exfoliation of sealing resin 5 and insulating sheet 3 starting from the end portion of metal base plate 2. Sealing resin 5 that has wrapped around the lower surface side of metal base plate 2 is formed only at the portion of step 9. Thus, step 9 is not a projection-and-depression structure involved with the insertion of such heat dissipation fin 6. While step 9 is formed at peripheral portion 7 in the direction from the lower surface toward the upper surface of metal base plate 2, the effect of suppressing the exfoliation of sealing resin 5 by anchoring effect is achieved also when step 9 is formed on the side surfaces of peripheral portion 7, for example.

Figure 9:
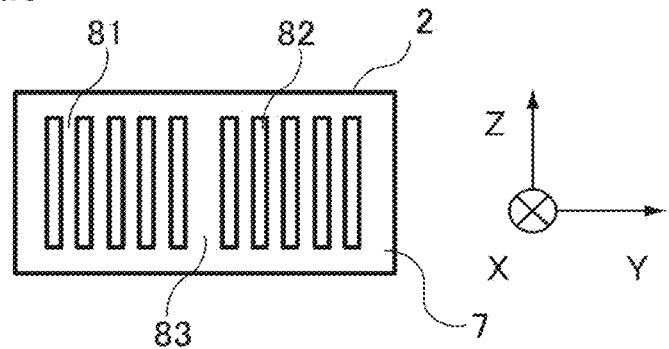
FIG. 9 is a schematic planar structural diagram of another metal base plate in the first embodiment of this invention.

FIG. 9 is a schematic planar structural diagram of another metal base plate in the first embodiment of this invention. FIG. 9 is a schematic planar structural diagram of metal base plate 2 as seen from its lower surface side. In the figure, depression 82 is provided in the form of a slit in metal base plate 2. The outer side (outer periphery) of projection and depression 8 is surrounded by projecting peripheral portion 7. Furthermore, metal base plate 2 includes a projection 83 in a portion of projection 81. This projection 83 may have the same height as peripheral portion 7, or may have the same height as projection 81. The thickness of projection 83 can be made greater than the thickness of projection 81, to increase the strength of metal base plate 2.

In either case of the height of projection 83, the warpage of metal base plate 2 by pressure during transfer molding can be suppressed. For this metal base plate 2, similar heat dissipation fins 60, 61, 62 and 63 that can be inserted into metal base plate 2 can be used.

Figure 10:
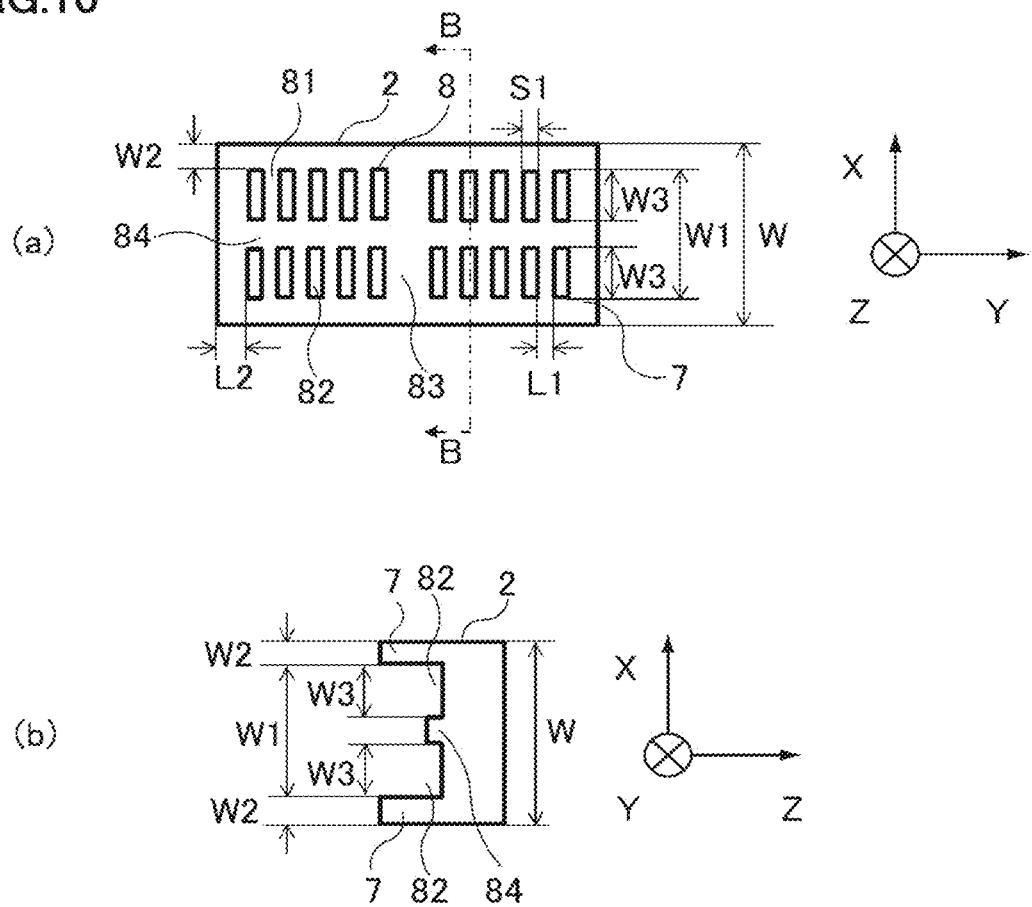
FIG. 10 shows schematic structural diagrams of another metal base plate in the first embodiment of this invention.

FIG. 10 shows schematic structural diagrams of another metal base plate in the first embodiment of this invention. FIG. 10(*a*) is a schematic planar structural diagram of metal base plate 2. FIG. 10(*b*) is a schematic sectional structural diagram of metal base plate 2 along a chain-dotted line B-B in FIG. 10(*a*). In the figures, projection and depression 8 have a shape provided with projections 83 and 84 for reinforcing metal base plate 2. Projection 84 is provided in a direction intersecting projection and depression 8. The direction intersecting projection and depression 8 may be orthogonal to projection and depression 8, or may be a diagonal direction of metal base plate 2.

The width of projection 84 may be the same as the thickness of projection 83, for example. The thickness of projection 83 and the width of projection 84 do not necessarily need to have the same size, and may have such sizes as to contribute to the reinforcement of metal base plate 2. The width of projection 84 may be the same as the width of peripheral portion 7. The height of these projections 83 and 84 may be the same as the height of peripheral portion 7, or may be the same as the height of projection and depression 8. In particular, the strength of metal base plate 2 can be increased even when the height of projection 84 is only slightly greater than a bottom surface of depression 82, as shown in FIG. 10(*b*). Again in this case, when the heat dissipation fin is inserted into depression 82, a structure is provided in which the heat dissipation fin is supported by substantially the entire surfaces of projections 81 in the width direction. Such a shape permits transfer molding at higher pressure.

Figure 11:
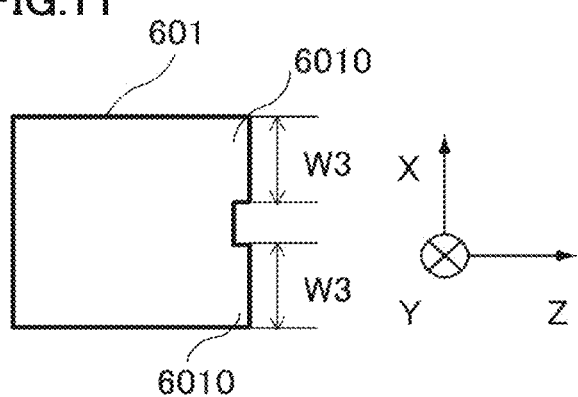
FIG. 11 is a schematic diagram of another heat dissipation fin in the first embodiment of this invention.
Figure 12:
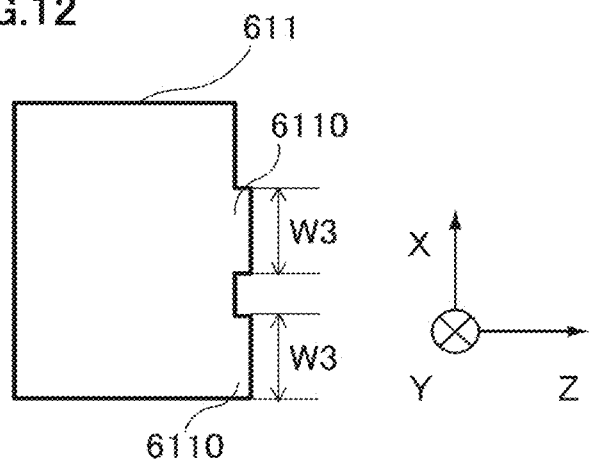
FIG. 12 is a schematic diagram of another heat dissipation fin in the first embodiment of this invention.
Figure 13:
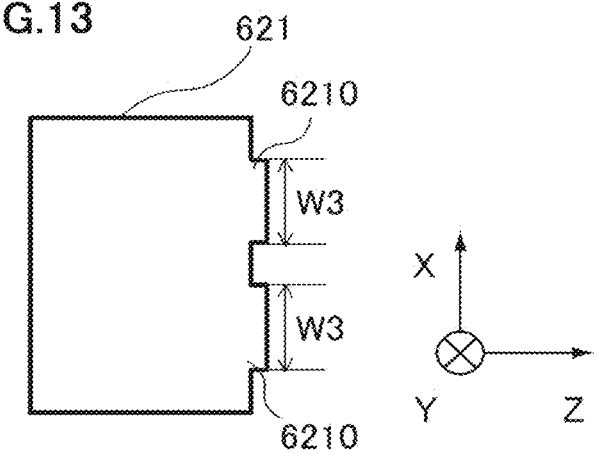
FIG. 13 is a schematic diagram of another heat dissipation fin in the first embodiment of this invention.
Figure 14:
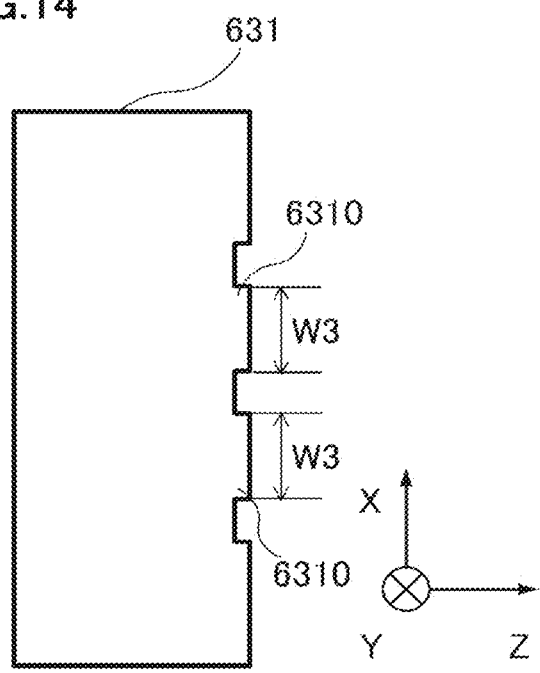
FIG. 14 is a schematic diagram of another heat dissipation fin in the first embodiment of this invention.

FIG. 11 is a schematic diagram of another heat dissipation fin in the first embodiment of this invention. FIG. 12 is a schematic diagram of another heat dissipation fin in the first embodiment of this invention. FIG. 13 is a schematic diagram of another heat dissipation fin in the first embodiment of this invention. FIG. 14 is a schematic diagram of another heat dissipation fin in the first embodiment of this invention. In the figures, heat dissipation fins 601, 611, 621 and 631 include protrusions 6010, 6110, 6210 and 6310 each inserted into depression 82 of projection and depression 8 shown in FIG. 10. Heat dissipation fins 601, 611, 621 and 631 have shapes that can be inserted into metal base plate 2 shown in FIG. 10.

Figure 15:
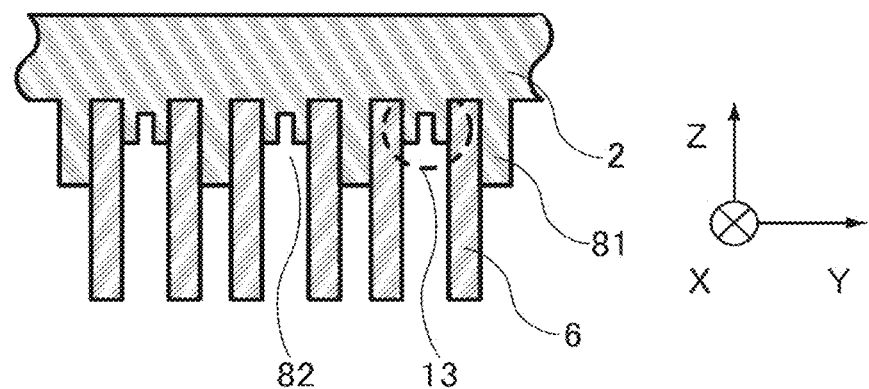
FIG. 15 shows the shape of a swaging portion of the heat dissipation fin of the metal base plate in the first embodiment of this invention.

FIG. 15 shows the shape of a swaging portion of the heat dissipation fin of the metal base plate in the first embodiment of this invention. In the figure, a swaging portion 13 is provided during swaging of heat dissipation fin 6 to projection and depression 8. Swaging portion 13 is provided in depression 82 sandwiched between two opposite projections 81, has a protruding wall lower in height than projection 81, and swages heat dissipation fin 6 by this protruding wall and projection 81. Here, two protruding walls are provided in depression 82 for swaging heat dissipation fins 6, with a groove formed between these protruding walls.

Next, a method of manufacturing semiconductor device 100 of the first embodiment configured as described above is described. Basically, semiconductor device 100 can be fabricated with a manufacturing method similar to a conventional manufacturing method, but is different from a conventional manufacturing method in a metal member forming step and a transfer molding step.

Figure 16:
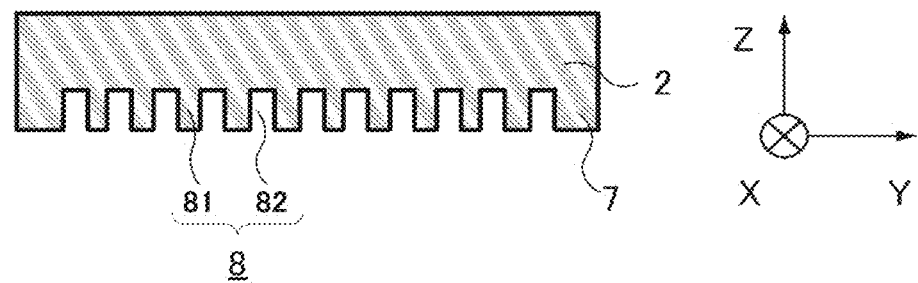
FIG. 16 is a schematic sectional structural diagram of a step of manufacturing the semiconductor device in the first embodiment of this invention.
Figure 17:
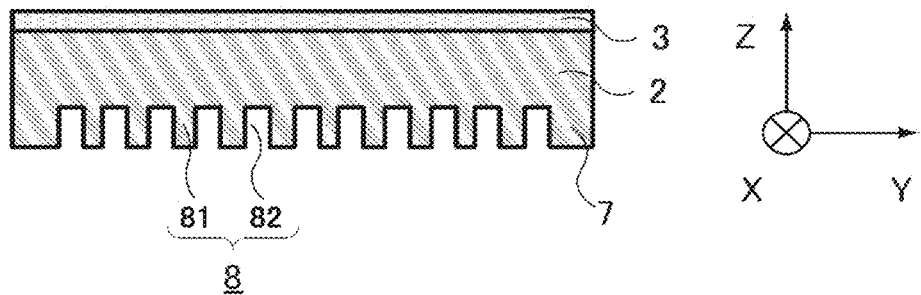
FIG. 17 is a schematic sectional structural diagram of a step of manufacturing the semiconductor device in the first embodiment of this invention.
Figure 18:
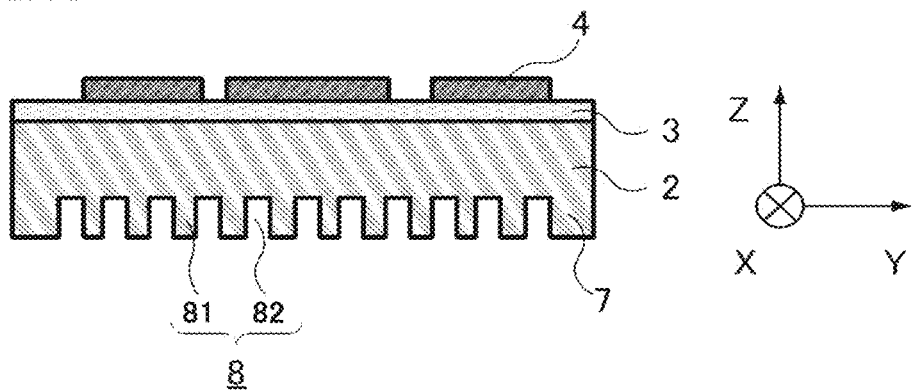
FIG. 18 is a schematic sectional structural diagram of a step of manufacturing the semiconductor device in the first embodiment of this invention.
Figure 19:
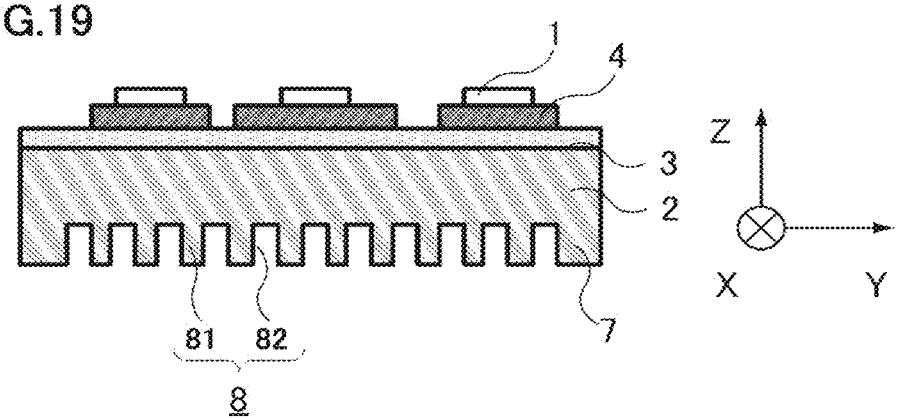
FIG. 19 is a schematic sectional structural diagram of a step of manufacturing the semiconductor device in the first embodiment of this invention.
Figure 20:
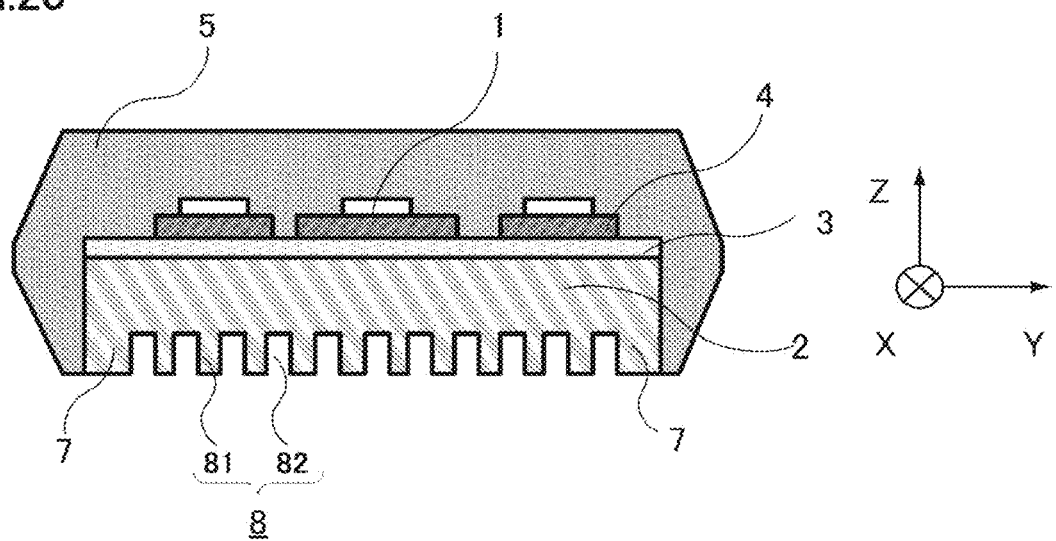
FIG. 20 is a schematic sectional structural diagram of a step of manufacturing the semiconductor device in the first embodiment of this invention.
Figure 21:
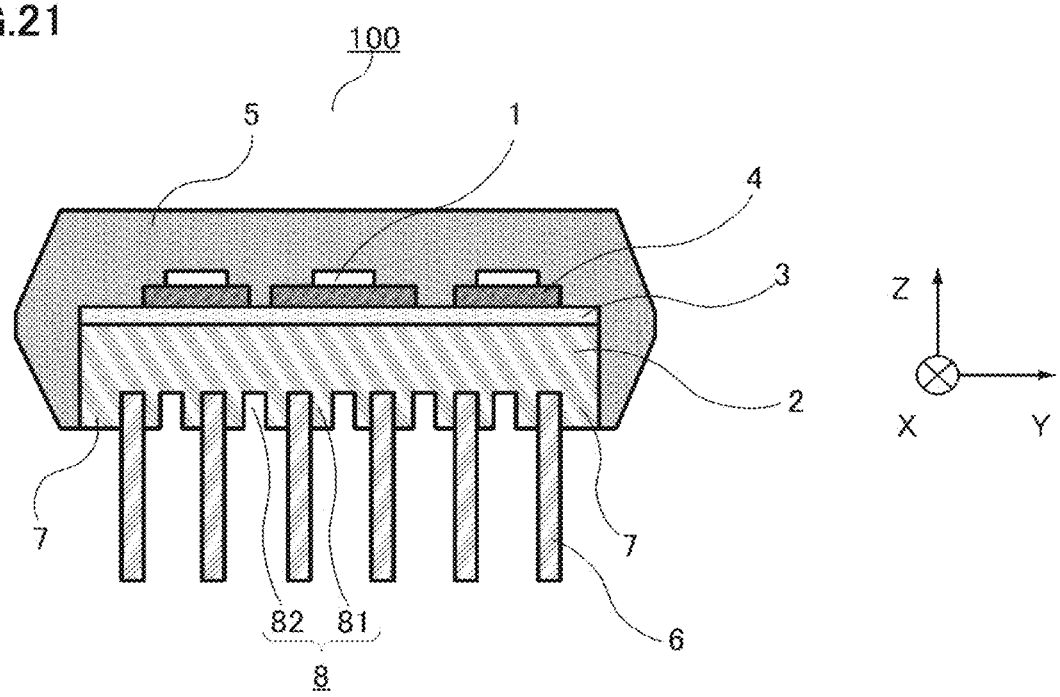
FIG. 21 is a schematic sectional structural diagram of a step of manufacturing the semiconductor device in the first embodiment of this invention.
Figure 22:
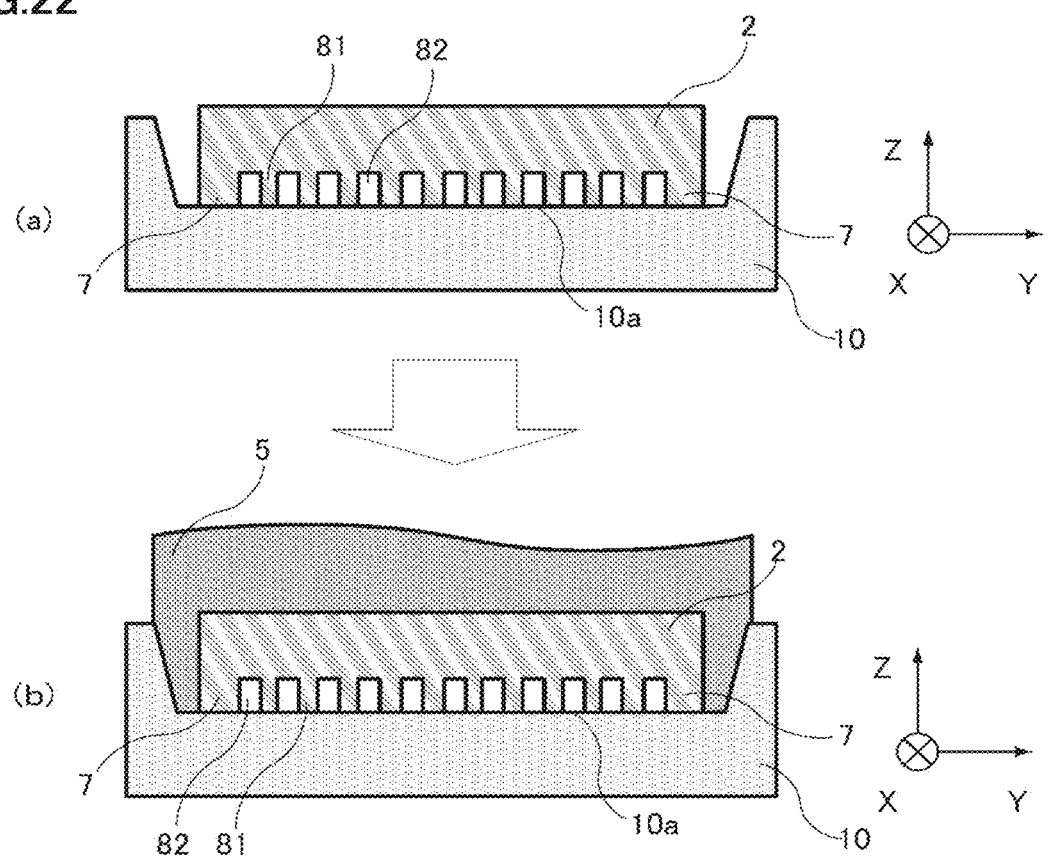
FIG. 22 shows schematic sectional structural diagrams during transfer molding in the first embodiment of this invention.
Figure 23:
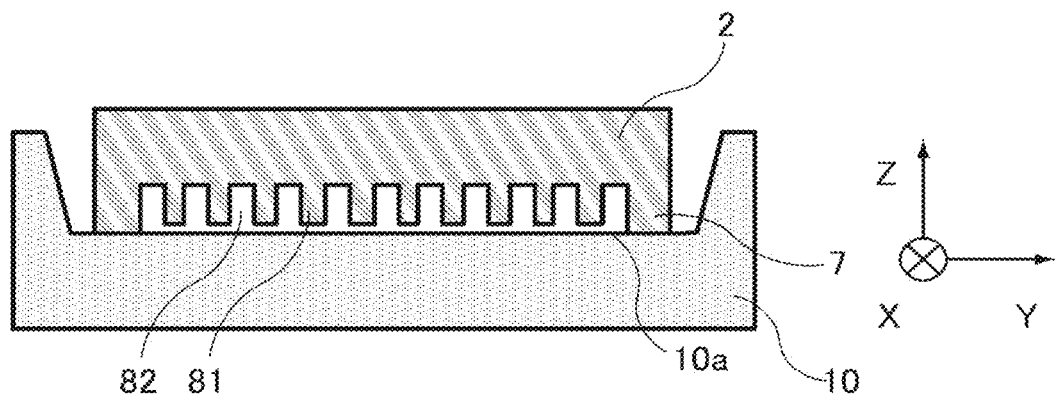
FIG. 23 is a schematic sectional structural diagram during another transfer molding in the first embodiment of this invention.

FIGS. 16 to 21 are schematic sectional structural diagrams of steps of manufacturing the semiconductor device in the first embodiment of this invention. FIG. 16 is a schematic sectional structural diagram showing a metal member forming step. FIG. 17 is a schematic sectional structural diagram showing an insulating layer forming step. FIG. 18 is a schematic sectional structural diagram showing a metal layer forming step. FIG. 19 is a schematic sectional structural diagram showing a semiconductor element joining step. FIG. 20 is a schematic sectional structural diagram showing a sealing resin curing step. FIG. 21 is a schematic sectional structural diagram showing a fin inserting step. Semiconductor device 100 can be manufactured by the steps from FIGS. 16 through 21. When heat dissipation fin 6 is not used, semiconductor device 100 is completed by the steps through FIG. 20. FIG. 22 shows schematic sectional structural diagrams during transfer molding in the first embodiment of this invention. FIG. 23 is a schematic sectional structural diagram during another transfer molding in the first embodiment of this invention.

In the figures, projecting peripheral portion 7 of metal base plate 2 is disposed in contact with a bottom surface 10*a* of a molding die 10. FIG. 22 shows an example structure in which projection and depression 8 are in contact with bottom surface 10*a* of molding die 10. FIG. 23 shows an example structure in which projection and depression 8 are not in contact with bottom surface 10*a* of molding die 10. FIG. 22(*a*) represents a state in which metal base plate 2 has been disposed in molding die 10, and FIG. 22(*b*) represents a state in which sealing resin 5 has been press-fitted into molding die 10.

First, as shown in FIG. 16, depressions 82 in the form of slits (in the form of lines) are formed at prescribed intervals on the lower surface (the other surface) of metal base plate 2 made of aluminum or the like. Here, if swaging is to be used as a method of fixing heat dissipation fin 6, the shape of projection and depression 8 may be devised to include swaging portion 13 as shown in FIG. 15, to facilitate the swaging of heat dissipation fin 6 to semiconductor device 100 (metal base plate 2). Depressions 82 in the form of slits are formed so as not to penetrate to the outermost periphery (peripheral portion 7) of the lower surface of metal base plate 2, and the outermost periphery (peripheral portion 7) is formed to have a constant height. Accordingly, projecting peripheral portion 7 is formed to surround projection and depression 8. A tip end portion of projection 81 of projection and depression 8 provided in the form of a slit is set to a height equal to or lower than the height of projecting peripheral portion 7 (metal member forming step).

Metal base plate 2 may be formed by being cut from a metal block, or may be integrally formed using a die. Here, peripheral portion 7 formed in metal base plate 2 is formed at a constant height within ranges of the accuracy of surface leveling of the metal block and the accuracy of the die.

Next, as shown in FIG. 17, insulating sheet 3 is formed by applying epoxy-based resin to the upper surface (one surface) of metal base plate 2 opposite to the surface provided with projection and depression 8 (insulating layer forming step). Next, as shown in FIG. 18, metal wiring pattern 4 can be formed by laminating a copper plate, for example, on insulating sheet 3, and an etching process and the like thereafter (metal layer forming step).

Next, as shown in FIG. 19, solder paste (not shown) is applied to a prescribed position of this metal wiring pattern 4, and an electronic component such as semiconductor element 1 is joined and mounted on this solder paste by a reflow process and the like. That is, metal base plate 2 provided with projection and depression 8 is heated to high temperature to melt the applied solder paste under the high temperature, thereby electrically connecting the electronic component such as semiconductor element 1 and metal wiring pattern 4 (semiconductor element joining step).

Next, metal wiring pattern 4 and semiconductor element 1 are electrically connected by a bonding wire (not shown) which is a metal wire (metal wire forming step). While a bonding wire is used here, any wire may be used as long as they can be electrically connected.

Next, to resin-seal the entirety of semiconductor element 1, metal wiring pattern 4, insulating sheet 3 and the like by transfer molding using sealing resin 5, as shown in FIG. 22(a), metal base plate 2 is mounted in molding die 10 by bringing bottom surface 10a of molding die 10 into contact with peripheral portion 7 (metal member mounting step).

Next, as shown in FIG. 22(b), sealing resin 5 is poured by a transfer molding machine (sealing step). Accordingly, the members formed on metal base plate 2 are sealed with sealing resin 5. Sealing resin 5 covers the entire side surfaces of metal base plate 2. Accordingly, the outer peripheral side surfaces of peripheral portion 7 are also covered by sealing resin 5. Here, since peripheral portion 7 is continuously formed to surround projection and depression 8, sealing resin 5 is prevented from flowing into projection and depression 8 during transfer molding. It should be noted that FIG. 22 only shows metal base plate 2 and a lower die half of molding die 10, a portion above insulating sheet 3 not being shown.

Here, sealing resin 5 may be poured in a reduced-pressure atmosphere, whereby the formation of voids in sealing resin 5 can be suppressed. As shown in FIG. 20, sealing resin 5, which is thermosetting resin such as epoxy resin, is cured by heating within molding die 10, and can be removed from molding die 10 after a certain period of time (sealing resin curing step). Subsequently, additional heat treatment may be performed in an oven or the like as needed, in order to further facilitate the curing of sealing resin 5.

The steps up until the resin sealing by transfer molding are not limited to this process. A method may be employed in which metal base plate 2 provided with insulating sheet 3 before the curing of sealing resin 5 on the upper surface of metal base plate 2 opposite to the surface provided with projection and depression 8, and a lead frame having the electronic component such as semiconductor element 1 mounted thereon in advance by a reflow process and the like can be mounted in molding die 10, and sealing resin 5 is poured by the transfer molding machine, whereby insulating sheet 3 is heated, pressed and cured.

Lastly, as shown in FIG. 21, heat dissipation fin 6 is inserted into depression 82, to complete semiconductor device 100. Heat dissipation fin 6 may be attached depending on the amount of heat generation in semiconductor device 100, and does not need to be attached if the heat can be dissipated by projection and depression 8 (fin inserting step). Heat dissipation fin 6 can be fixed to depression 82 by an insertion method using swaging, brazing, or a fixing member.

Here, problems with the use of a metal base plate having a conventional structure will be described using FIGS. 24 to 26.

Figure 24:
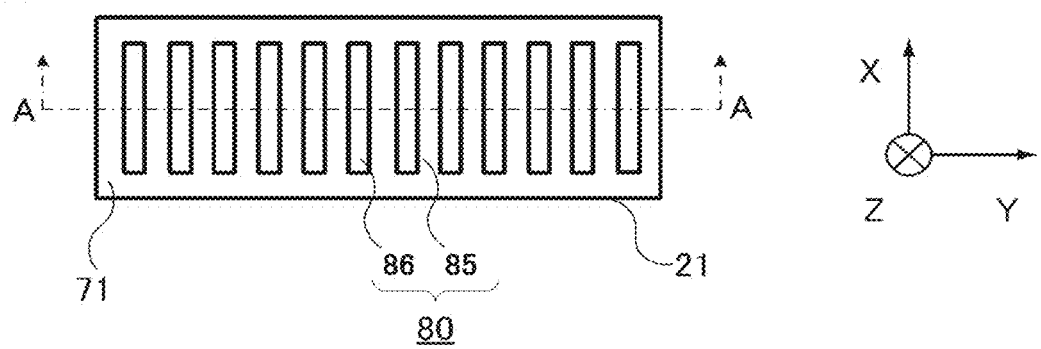
FIG. 24 is a schematic planar structural diagram of a metal base plate having a conventional structure.

FIG. 24 is a schematic planar structural diagram of a metal base plate having a conventional structure. FIG. 25 is a schematic sectional structural diagram of the metal base plate having the conventional structure. FIG. 25 is a schematic sectional structural diagram along a chain-dotted line A-A in FIG. 24. FIG. 26 shows schematic sectional structural diagrams during transfer molding using the metal base plate having the conventional structure. FIG. 26(a) represents a state in which a metal base plate 21 has been disposed in a molding die 101, and FIG. 26(b) represents a state in which sealing resin 5 has been press-fitted into molding die 101. In the figures, metal base plate 21 has a projection and a depression 80 having a projection 85 and a depression 86. Metal base plate 21 is disposed in molding die 101.

Figure 25:
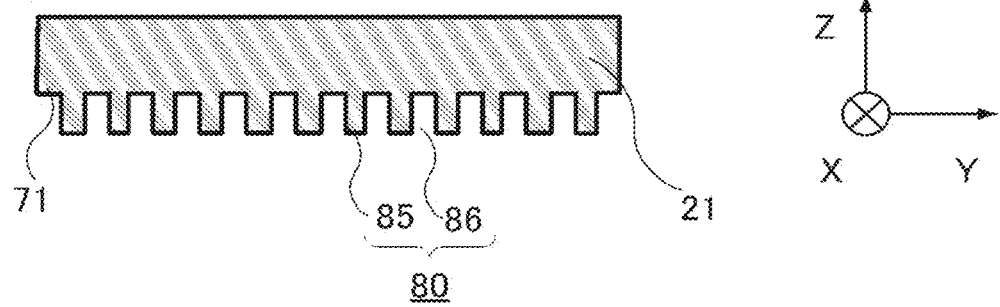
FIG. 25 is a schematic sectional structural diagram of the metal base plate having the conventional structure.
Figure 26:
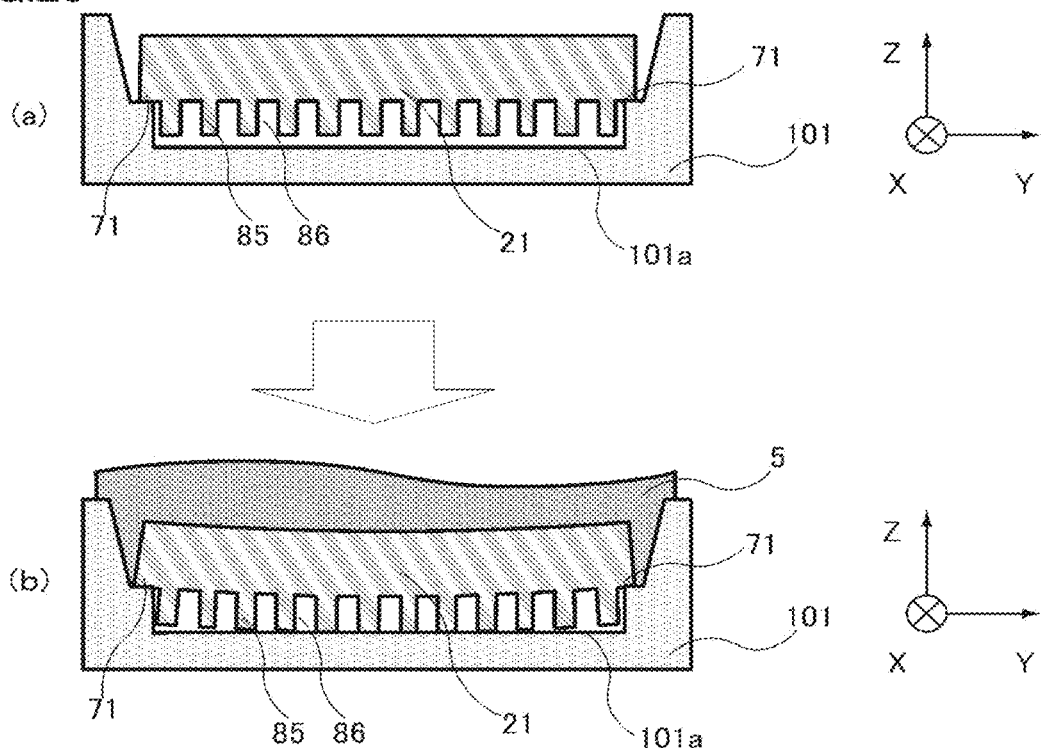
FIG. 26 shows schematic sectional structural diagrams during transfer molding using the metal base plate having the conventional structure.

When projections 85 (depressions 86) are aligned in one direction at a lower surface (the other surface) of metal base plate 21, the outermost periphery of the lower surface of metal base plate 21 is provided with a flat portion 71, as shown in FIG. 25, in order to achieve molding without causing leakage of sealing resin 5 to projection and depression 80 in a transfer molding step. Resin molding is performed while this flat portion 71 is pressed as a sealing surface against molding die 101 as shown in FIG. 26.

Here, if importance is attached to the sealing performance during resin molding, a clearance is needed between tip end portions of projections 85 of projections and depressions 80 and a bottom surface 101a of molding die 101, in consideration of manufacturing dimensional variation among the tip end portions of projections 85 (see FIG. 26(a)). When resin molding is performed with this clearance being provided, metal base plate 21 is deformed (warped) due to resin molding pressure (see FIG. 26(b)). Accordingly, exfoliation or cracks may occur in insulating sheet 3 provided on metal base plate 21, resulting in reduced reliability of a semiconductor device including this metal base plate 21.

In semiconductor device 100 having the structure of metal base plate 2 of the present first embodiment, however, the outermost periphery of the lower surface of metal base plate 2 provided with projection and depression 8 is provided with projecting peripheral portion 7 of a constant height to surround projection and depression 8. Accordingly, sealing resin 5 can be prevented from flowing toward projection and depression 8 during resin molding. In addition, heat dissipation fin 6 is inserted into depression 82 of projection and depression 8 after the resin molding, thereby increasing the heat dissipation properties. Furthermore, with the structure that suppresses the deformation of metal base plate 2 as compared to a conventional structure, higher resin molding pressure than was conventionally possible can be achieved, thereby permitting the application of insulating sheet 3 having higher heat dissipation performance.

In the semiconductor device configured as above, since projecting peripheral portion 7 is provided to surround projection and depression 8 formed on the lower surface of metal base plate 2, the warpage of metal base plate 2 due to molding pressure during transfer molding can be reduced, and the occurrence of exfoliation of and cracks in insulating sheet 3 formed on the upper surface of metal base plate 2 can be suppressed, thereby improving the reliability of the semiconductor device.

In addition, the reduced warpage of metal base plate 2 permits resin molding at higher molding pressure than was conventionally possible, thereby permitting the application of insulating sheet 3 having higher thermal conductivity than in conventional technique where the pressure was required to carry out the function.

Second Embodiment

The present second embodiment is different in that insulating sheet 3 having a higher thermal conductivity than that of insulating sheet 3 which is an insulating layer in the first embodiment is employed. By employing insulating sheet 3 having a higher thermal conductivity in this manner, the heat dissipation properties of the semiconductor device can be improved while the reliability of semiconductor device is maintained.

Insulating sheet 3 is formed, for example, by filling thermosetting resin such as epoxy resin with inorganic powders such as silica, alumina, boron nitride, or aluminum nitride, used either alone or as a mixture, which has high thermal conductivity for improving the heat dissipation properties. Insulating sheet 3 having higher heat dissipation properties needs to be more highly filled with the inorganic powders, and is filled with boron nitride or aluminum nitride having higher thermal conductivity among the inorganic powders. However, to ensure the inherent thermal conductivity and insulation properties of insulating sheet 3, filling with a higher amount of inorganic powders requires curing under higher pressure during heating and curing of the resin such as epoxy resin serving as a base of insulating sheet 3.

In particular, the shape of inorganic powders has a significant effect. When boron nitride having high thermal conductivity is used, since its powders are scale-shaped, higher pressure is often required to attain the inherent properties than when other powders having a crushed shape or spherical shape such as silica or alumina are used for the filling. When insulating sheet 3 is heated, pressed and cured within the transfer molding machine, insulating sheet 3 having higher thermal conductivity can be applied by using metal base plate 2 of the present invention.

When boron nitride is used as the inorganic powders to fill insulating sheet 3, where the inorganic powders are in an amount of less than 40 volume % including the boron nitride, the inherent thermal conductivity and insulation properties can be ensured at a molding pressure of about 5 MPa during the heating and curing, and the thermal conductivity is about 2 to 5 W/(m·K). Where the inorganic powders are in an amount of 40 volume % or more and less than 50 volume %, a molding pressure of about 10 MPa is required, and the thermal conductivity is about 4 to 6 W/(m·K). Here, when metal base plate 21 having the conventional structure shown in FIGS. 24 to 26 is used, cracks may occur in insulating sheet 3 during resin molding, which may result in a significantly reduced breakdown voltage although the thermal conductivity manifests itself.

Moreover, when the inorganic powders in an amount of 50 volume % or more and less than 60 volume % including boron nitride is used for the filling, a thermal conductivity of about 5 up to 14 W/(m·K) can manifest itself, but a molding pressure of 10 MPa or more is required, and a semiconductor device having higher reliability can be obtained by applying the structure of the present invention. It should be noted that the thermal conductivity varies depending on whether the boron nitride is used as a simple substance, or as mixed with other powders, as the inorganic powders for the filling, which can be appropriately selected as needed.

In the semiconductor device configured as above, since projecting peripheral portion 7 is provided to surround projection and depression 8 formed on metal base plate 2, the warpage of metal base plate 2 due to molding pressure during transfer molding can be reduced, and the occurrence of exfoliation of and cracks in insulating sheet 3 formed on the upper surface of metal base plate 2 can be suppressed, thereby improving the reliability of the semiconductor device.

In addition, the reduced warpage of metal base plate 2 permits resin molding at higher molding pressure than was conventionally possible, thereby permitting the application of insulating sheet 3 having higher thermal conductivity than in conventional technique where the pressure was required to carry out the function.

Third Embodiment

The present third embodiment is different in that insulating sheet 3 used in the first embodiment is replaced by a ceramic substrate 31. When insulating sheet 3 is changed to ceramic substrate 31 in this manner, the warpage of ceramic substrate 31 can again be suppressed, thereby improving the reliability of the semiconductor device.

Figure 27:
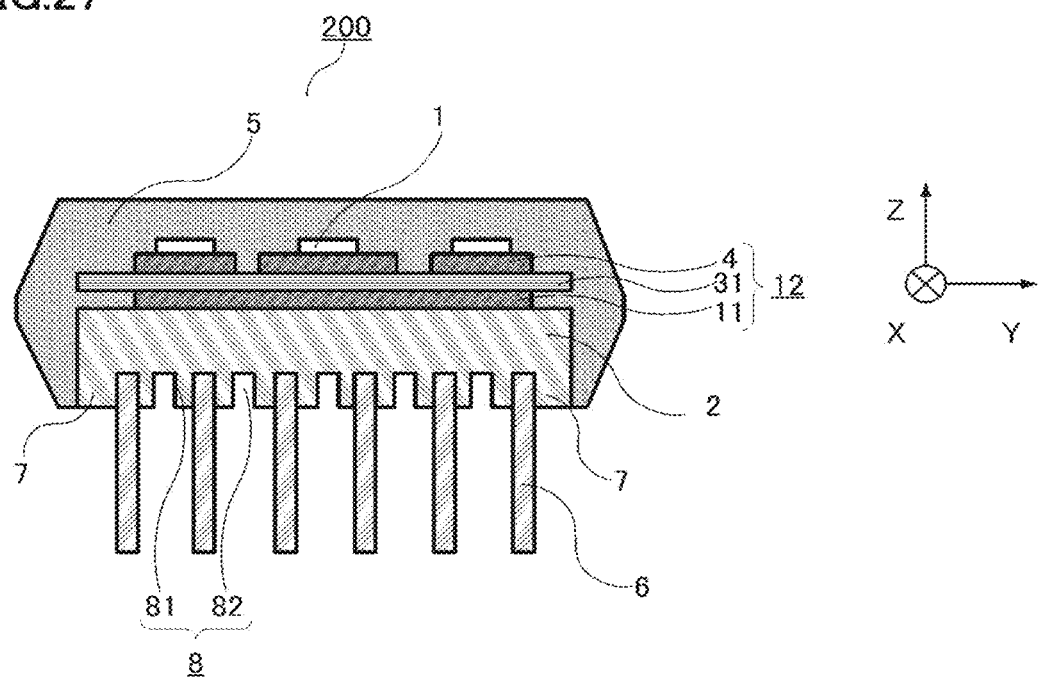
FIG. 27 is a schematic sectional structural diagram of a semiconductor device in a third embodiment of this invention.

FIG. 27 is a schematic sectional structural diagram of a semiconductor device in the third embodiment of this invention. It should be noted that FIG. 27 is a sectional view schematically showing a configuration of the semiconductor device, and therefore shows positional relation of respective parts, components, and the like in an overview manner.

In the figure, a semiconductor device 200 includes semiconductor element 1, metal base plate 2 which is a metal member, ceramic substrate 31 which is an insulating layer, metal wiring patterns 4 and 11 which are metal layers, sealing resin 5, heat dissipation fin 6 which is a fin, peripheral portion 7, projection and depression 8, projection 81, and depression 82. An insulating substrate 12 includes metal wiring patterns 4 and 11 on opposite surfaces of ceramic substrate 31.

Ceramic substrate 31 can be used, other than insulating sheet 3, for a portion corresponding to the insulating layer. When applied to metal base plate 21 as shown in FIG. 25, there was a problem of the occurrence of cracks in ceramic substrate 31 due to the deformation of metal base plate 21 during the molding as shown in FIG. 26, resulting in deteriorated insulation properties. However, with this structure as shown in FIG. 27, a semiconductor device having high insulation reliability can be obtained even when ceramic substrate 31 is applied.

When ceramic substrate 31 is used, metal wiring pattern 4 is formed in advance on an upper surface of ceramic substrate 31, and semiconductor element 1 is joined and mounted on this metal wiring pattern 4 with solder (not shown). In addition, metal wiring pattern 11 is formed in advance on a lower surface of ceramic substrate 31. Metal wiring patterns 4 and 11 are formed on the opposite surfaces of ceramic substrate 31, to thereby form insulating substrate 12. Furthermore, ceramic substrate 31 having metal wiring patterns 4 and 11 formed on its opposite surfaces is joined to metal base plate 2 by joining metal wiring pattern 11 and metal base plate 2 to each other with solder (not shown). Then, sealing resin 5 can be poured by the transfer molding machine to manufacture semiconductor device 200. Basically, semiconductor device 200 can be manufactured by the manufacturing steps described in the first embodiment, by changing insulating sheet 3 to insulating substrate 12 (ceramic substrate 31).

In the semiconductor device configured as above, since projecting peripheral portion 7 is provided to surround projection and depression 8 formed on the lower surface of metal base plate 2, the warpage of metal base plate 2 due to molding pressure during transfer molding can be reduced, and the occurrence of exfoliation of and cracks in ceramic substrate 31 (insulating substrate 12) formed on the upper surface of metal base plate 2 can be suppressed, thereby improving the reliability of the semiconductor device.

REFERENCE SIGNS LIST

1 semiconductor element; 2, 21 metal base plate; 3 insulating sheet; 4, 11 metal wiring pattern; 5 sealing resin; 6, 60, 61, 62, 63, 601, 611, 621, 631 heat dissipation fin; 7 peripheral portion; 8, 80 projection and depression; 9 step; 10, 101 molding die; 10a, 101a bottom surface of molding die; 12 insulating substrate; 13 swaging portion; 31 ceramic substrate; 71 flat portion; 81, 83, 84, 85 projection; 82, 86 depression; 100, 200 semiconductor device; 600, 610, 620, 630, 6010, 6110, 6210, 6310 protrusion.

The invention claimed is:

1. A semiconductor device comprising:
    a metal member provided, on a lower surface of the metal member, with
        projections and depressions alternately arranged and aligned such that surfaces of the projections in a width direction face one another in one direction,
        a projecting peripheral portion surrounding the projections and the depressions and having a height greater than or equal to a height of each of the projections of the projections and the depressions; and
        protruding portions provided in the depressions of the projections and the depressions in a direction intersecting the width direction of the projections, the protruding portions protruding from bottom surfaces of the depressions of the projections and the depressions and each having a height greater than a height of the bottom surfaces of the depressions of the projections and the depressions and smaller than the height of the projections of the projections and the depressions;
    an insulating layer formed on an upper surface of the metal member;
    a metal layer formed on an upper surface of the insulating layer;
    a semiconductor element joined to an upper surface of the metal layer; and
    a sealing resin to seal the semiconductor element, the metal layer and the insulating layer, wherein
        each of the depressions extends in the width direction from a first side of the projecting peripheral portion to an opposing side of the projecting peripheral portion,
        a width in the width direction of each of the depressions is wider than a width of the depressions in a direction intersecting the width direction,
        one of the protruding portions is arranged in each of the depressions,
        each of the depressions having the one protruding portion is configured to receive a fin oriented longitudinally in the width direction, and
        the one protruding portion is configured to cooperate with receiving the fin and with fixing the fin.

2. The semiconductor device according to claim 1, wherein
    the height of the peripheral portion is constant.

3. The semiconductor device according to claim 1, wherein
    a fin is inserted into the depression of the projection and the depression.

4. The semiconductor device according to claim 3, wherein
    the fin has a portion wider in a width direction than its portion inserted into the depression of the projection and the depression.

5. The semiconductor device according to claim 3, wherein:
    the fin has a width substantially equal to a width of the depression,
    the fin has a notch in one side corresponding to the one protruding portion, and
    the one side is inserted in the depression.

6. The semiconductor device according to claim 1, wherein
    the projection of the projection and the depression includes projections of different thicknesses.

7. The semiconductor device according to claim 1, wherein
    the peripheral portion is provided with a step at its outer peripheral portion.

8. The semiconductor device according to claim 1, wherein
    the insulating layer is an insulating sheet.

9. The semiconductor device according to claim 8, wherein
    the insulating sheet includes boron nitride, and is filled with an inorganic powder material in an amount of 40 volume % or more.

10. The semiconductor device according to claim 1, wherein
    the insulating layer is a ceramic substrate.

11. The semiconductor device according to claim 1, wherein
    a width in the width direction of each of the protruding portions provided in the depressions of the projections and depressions being less than a sum of a width in the width direction of the projecting peripheral portion and a width in the width direction of a respective depression portion located between the projections provided in the depressions and the projections and the projection peripheral portion.

12. The semiconductor device according to claim 11, wherein
    a width of each of the protruding portions provided in the depressions of the projections and the depressions is the same as the width of the projecting peripheral portion.

13. The semiconductor device according to claim 1, wherein, in a direction in which the projections project from the metal member, a height of the metal member on the protruding portions is higher than a height of the metal member on the depressions.

* * * * *